US00RE36740E

United States Patent [19]

Ichihara et al.

[11] E Patent Number: Re. 36,740

[45] Reissued Date of Patent: Jun. 20, 2000

[54] CATA-DIOPTRIC REDUCTION PROJECTION OPTICAL SYSTEM

[75] Inventors: Yutaka Ichihara; Hideo Mizutani; Sumio Hashimoto; Yutaka Suenaga, all of Tokyo, Japan

[73] Assignee: Nikon Corporation, Tokyo, Japan

[21] Appl. No.: 08/490,700

[22] Filed: Jun. 14, 1995

Related U.S. Patent Documents

Reissue of:

[64] Patent No.: 5,220,454
Issued: Jun. 15, 1993
Appl. No.: 07/950,765
Filed: Sep. 24, 1992

U.S. Applications:

[63] Continuation of application No. 07/727,307, Jul. 10, 1991, abandoned, which is a continuation of application No. 07/509,741, Apr. 17, 1990, abandoned.

[30] Foreign Application Priority Data

Mar. 30, 1990 [JP] Japan ..... 2-83468

[51] Int. Cl.[7] ..... G02B 5/30; G02B 17/08; G02B 27/28

[52] U.S. Cl. ..... 359/487; 359/459; 359/727; 359/732

[58] Field of Search ..... 359/487, 495, 359/496, 497, 629, 634, 638, 726, 727, 732, 494, 488, 499

[56] References Cited

U.S. PATENT DOCUMENTS

| | | | |
|---|---|---|---|
| 1,797,202 | 3/1931 | Warmisham | 359/771 |
| 2,076,686 | 4/1937 | Tronnier | 359/771 |
| 3,698,808 | 10/1972 | Delmas . | |
| 3,753,608 | 8/1973 | Bernal . | |
| 4,084,883 | 4/1978 | Eastman et al. . | |
| 4,334,300 | 6/1982 | Arquie et al. . | |
| 4,564,931 | 1/1986 | O'Hara et al. . | |
| 4,609,258 | 9/1986 | Adachi et al. . | |
| 4,634,232 | 1/1987 | Takeoka . | |
| 4,662,722 | 5/1987 | Buczek et al. . | |
| 4,714,310 | 12/1987 | Peppers et al. . | |
| 4,747,678 | 5/1988 | Shafer et al. . | |
| 4,783,152 | 11/1988 | Nishimoto . | |
| 4,793,696 | 12/1988 | Suh . | |
| 4,953,960 | 9/1990 | Williamson . | |
| 4,963,003 | 10/1990 | Hiiro . | |
| 4,966,438 | 10/1990 | Mouchart . | |
| 4,969,730 | 11/1990 | van den Brandt . | |
| 5,212,593 | 5/1993 | Williamson et al. | 359/487 |

*Primary Examiner*—Ricky D. Shafer
*Attorney, Agent, or Firm*—Vorys, Sater, Seymour and Pease LLP

[57] ABSTRACT

In a cata-dioptric optical system having a combination of a reflection system and a refraction system for reduction-projecting an object on a first plane onto a second plane, a polarization beam splitter and a quarter wavelength plate are provided to split the incident light and the reflected light. The light beam directed to the polarization beam splitter is converted to a substantially collimated light beam by a first group of lenses. A second group of lenses are arranged between the polarization beam splitter and a concave reflection mirror to diverge the light beam. The light reflected by the concave reflection mirror is directed back to the polarization beam splitter with a substantially collimated state by the second group of lenses. The light beam from the second group of lenses transmitted through the polarization beam splitter is focused by a third group of lenses having a positive refraction power to form a reduced image.

33 Claims, 5 Drawing Sheets

FIG. 3A
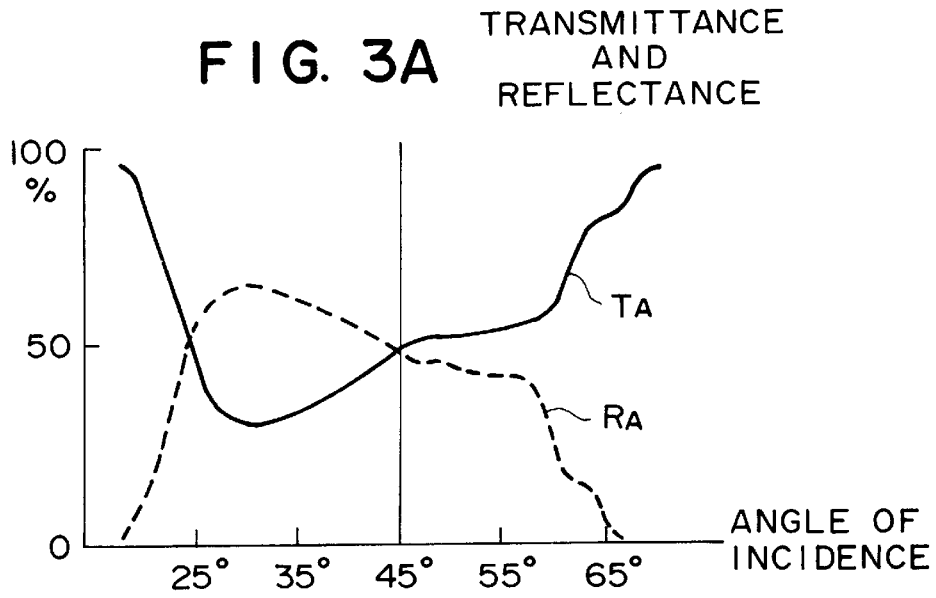
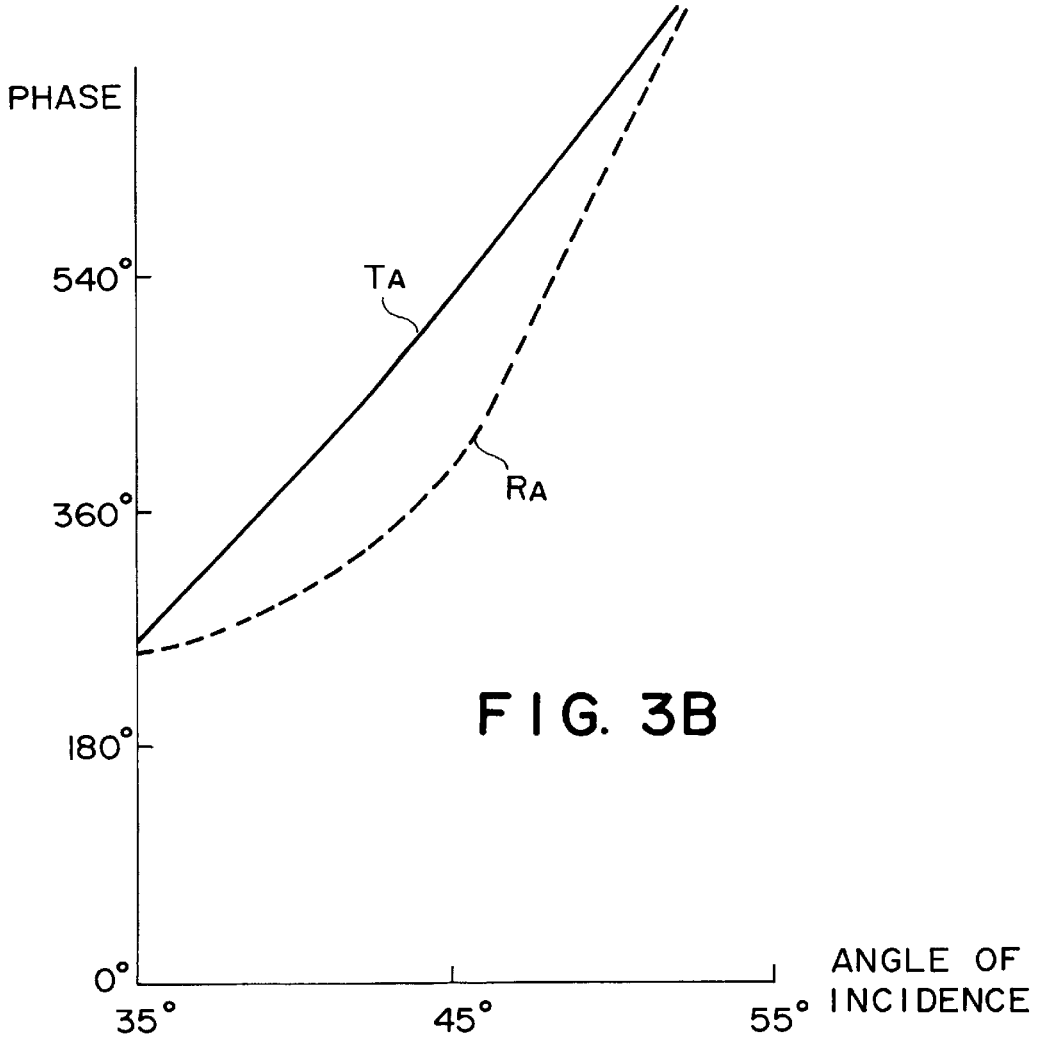
FIG. 3B

CATA-DIOPTRIC REDUCTION PROJECTION OPTICAL SYSTEM

Matter enclosed in heavy brackets [ ] appears in the original patent but forms no part of this reissue specification; matter printed in italics indicates the additions made by reissue.

This is a continuation of application Ser. No. 727,307 filed Jul. 10, 1991, which is a continuation of application Ser. No. 509,741 filed Apr. 17, 1990, both now abandoned.

BACKGROUND OF THE INVENTION

1. Field of the Invention

The present invention relates to an exposure apparatus used for the manufacture of a semiconductor device, and more particularly to a cata-dioptric optical system for reduction-projecting an enlarged real element pattern on a reticle.

2. Related Background Art

Semiconductor integrated circuit have been becoming finer and finer, and a higher resolution power is required for an exposure apparatus for making a pattern. In order to meet the requirement, it is necessary to shorten a wavelength of a light source and increase a numerical aperture (N.A.) of an optical system. However, as the wavelength is shortened, a glass material which can be practically used is limited due to the light absorption.

When the wavelength is shorter than 300 nm, the practically usable glass materials are only synthesized quartz and fluorspar (calcium fluoride). However, because of a poor temperature characteristic of the fluorspar, it may be used in only a small portion of optical elements of the optical system, and it is not desirable to use it in quantity. In addition, it is very difficult to manufacture a projection optical system which meets the above requirement by only a refraction system. It is almost impossible to manufacture a projection optical system having a large numerical of aperture by only a reflection system, because of difficulty in aberration correction.

Accordingly, various techniques to form the projection optical system by combining a reflection system and a refraction system have been proposed. As one example thereof, a ring view field optical system is disclosed in U.S. Pat. No. 4,747,678. In this optical system, off-axis light beams are used to present interference between an incident light and a reflected light, and only off-axis ring band portions are exposure areas. As a result, it is difficult to increase the numerical of aperture. Further, since it is not possible to expose an entire wafer to light when a pattern on a reticle or mask is to be transferred to the wafer, it is necessary to make the exposure while the reticle and the wafer are moved at different velocities determined by a reduction ratio of the optical system. As a result, a mechanical construction is complex and there is a big difficulty in maintaining a precision for the transfer of a very fine pattern.

U.S. Pat. No. 3,698,808 discloses a projection exposure apparatus which includes a cata-dioptric system which projects a whole reticle image by an on-axis light beam by using a beam splitter in the projection optical system. In the known apparatus, there are many flares due to reflection in a refraction plane of an optical system downstream of the beam splitter, and no attention is paid to the characteristics of the beam splitter such as unevenness of a reflection factor, absorption and change of phase. As a result, a resolution power is so low that the apparatus cannot be used as a semiconductor manufacturing exposure apparatus. Further, a light utilization efficiency due to light loss by the beam splitter is as low as 25–10%.

Japanese Laid-Open Patent Appln. No. 2-66510 which corresponds to U.S. patent application Ser. No. 223,968 filed on Jul. 15, 1988, now U.S. Pat. No. 4,953,960, discloses an optical system which includes a cata-dioptric optical system which uses a beam splitter in the projection optical system. In this optical system, however, many flares exist as they do in the optical system described above, and the light loss is large and the resolution power is low because of the non-uniformity of the reflection factor at the beam splitter and the non-uniformity of the phase change to an angle of incidence caused by the absorption, characteristic and the multi-layer film. Accordingly, it also has a big problem for practical use.

SUMMARY OF THE INVENTION

It is an object of the present invention to provide a reduction projection optical system having a good focusing characteristic, which includes a cata-dioptric system.

It is another object of the present invention to provide a cata-dioptric reduction projection optical system which has a large numerical of aperture and includes a small number of flares.

It is another object of the present invention to provide a reduction projection optical system which has a beam splitter in a projection optical system and prevents the reduction of a resolution power due to the non-uniformity of a reflection factor at the beam splitter and the non-uniformity of a phase change.

It is a further object of the present invention to provide a reduction projection optical system which corrects aberrations including astigmatism, distortion aberration and chromatic aberration by combining a reflection system, a refraction system, a polarization beam splitter and a quarter wavelength plate, even in a wavelength band in which the projection lens cannot be manufactured by only the refraction system.

The reduction projection optical system of the present invention comprises an optical system which is a combination of a reflection system and a refraction system, for reduction-projecting a predetermined pattern on a first plane onto a second plane. Basically, it has a construction disclosed in the U.S. Pat. No. 3,698,808.

In order to permit light exposure to an entire wide area, an on-axis light beam is used and a polarization beam splitter and a quarter wavelength plate are provided to separate an incident light from a reflected light. The light beam applied to the polarization beam splitter is converted to a substantially collimated light beam by a first group of lenses having a positive refraction power. A second group of lenses for diverging the light beam are arranged between the polarization beam splitter and a concave reflection mirror. The light reflected by the concave mirror is returned to the polarization beam splitter by the second group of lenses in almost collimated state. The light beam from the second group of lenses via the polarization beam splitter is focused by a third group of lenses having a positive refraction power to form a reduced image.

The present invention is explained in more detail with reference to a principle construction shown in FIG. 1. The optical system of the present invention comprises a first group of lenses $G_1$ having a positive refraction power for converting a light beam from a first plane (corresponding to a reticle plane) 10 to a substantially collimated light beam, a polarization beam splitter 11 for splitting the light beam from the first group of lenses $G_1$ into reflection and transmission in accordance with the polarization status, a second group of lenses $G_2$ having a negative refraction power arranged in a light path split by the polarization beam splitter 11 for diverging the light beam emitted from the polarization beam splitter 11, a concave reflection mirror 13 for focusing the diverged light beam from the second group of lenses $G_2$ and returning it to the polarization beam splitter 11 through the second group of lenses $G_2$, a third group of lenses $G_3$ having a positive refraction power for converging the light beam reflected by the concave reflection mirror 13 and emitted from the polarization beam splitter 11 to form a reduced image of the pattern of the first plane 10 onto a second plane (corresponding to a wafer) 20, and a quarter wavelength plate 12 arranged between the polarization beam splitter and the concave reflection mirror.

Preferably, the polarization light beam splitter is constructed to transmit the light beam reaching the concave reflection mirror 13 from the first plane and reflect the light beam reflected by the concave reflection mirror and reaching the second plane. It is preferable that the light beam converged by the first group of lenses $G_1$ and directed to the polarization beam splitter is substantially parallel to an optical axis AX1, and the light beam reflected by the concave reflection mirror and then reflected by the polarization beam splitter and directed to the third group of lenses $G_3$ is also substantially parallel to an optical axis AX2.

A polarization split plane of the polarization beam splitter may be on a slope plane against which two rectangular prisms are bonded together, or it may be formed on a thin plane-parallel plate arranged obliquely to the optical axis. Preferably, the polarization beam splitter of the present invention uses a beam splitter cube having a polarization split plane of a dielectric multi-layer film formed on a slope plane against which two prisms are bonded together.

Before the features of the present invention are explained, a result of analysis of harmful flares and light loss is explained for the construction disclosed in the Japanese Laid-Open Patent Application No. 2-66510.

FIG. 2 schematically shows the optical system disclosed in the Japanese Laid-Open Patent Application No. 2-66510. A light beam from a reticle 1 on which a pattern to be reduction-transferred is drawn passes through a lens 2 having a positive refraction power, a beam splitter 3 and a correction lens 4 and is reflected by a concave mirror 5. The light beam reflected by the concave mirror 5 passes through the correction lens 4 again, and is reflected by the beam splitter 3 and focused by a lens 6 having a positive refraction power to form a reduced image of the reticle pattern onto a wafer 7.

When the light beam from the reticle 1 passes through the beam splitter 3, the incident light is split into a reflected light and a transmitted light by a translucent film, but almost half of the light is reflected and the light is substantially lost by the absorption by the translucent film. Because almost half of the reflected light is reflected and scattered by the peripheral body tube structure, flare is produced. When the reflected light from the concave mirror 5 is returned to the beam splitter 3 and reflected thereby, almost half of the light is transmitted. The transmitted light causes a light loss and it is reflected by the reticle 1 and passes through the same light path as the focused light to reach the wafer 7. Accordingly, it forms a very strong ghost image and also flare. Further, since the light reflected by the surface of the lens 6 having the positive refraction power and the wafer is reflected by the beam splitter 3 and the concave mirror 5 and again reaches the wafer, that reflected light also because the flare.

For example, assuming that a reflectance of the beam splitter 3 is 50% and a reflectance of the wafer is 3%, the flare light amounts to 4–10% of the irradiation (light exposure) to the reticle. Since the flare light permitted for the limit resolution is approximately 2%, there is a practical problem with the prior art construction.

A metal thin film has been known as a conventional beam splitter translucent film. Since the metal film causes a large light absorption, the light loss is large. There is also a change in the refractive index of the optical system and a change in the shape due to heat generated by the light absorption so that berration of the optical system is produced. Accordingly, it is necessary to use a dielectric multi-layer film as a high efficiency translucent film. However, in the translucent film of the dielectric multi-layer film, it has been found that not only the angle characteristic of the reflectance is non-uniform but also the angle characteristic of the phase change caused by the reflection changes significantly.

The non-uniformity of the reflectance and the change of phase by the translucent film 3*a* of the beam splitter 3 are now explained. The dielectric multi-layer film has an advantage of small absorption but it also has an angle dependency characteristic in that the transmittance and the reflectance, and further the phase, change as the angle changes. Where the light directed to the beam splitter 3 is not a collimated light but a converging or diverging light beam, the transmittance and the reflectance change from place to place of the wave plane. Thus, the light intensity at the periphery of the wave plane in reduced and an effective numerical of aperture (N.A.) is reduced so that the resolution power is reduced. Further, since the phase changes from place to place of the wave plane, a wave plane aberration is produced. Because not only the reduction of the resolution power but also the distortion (distortion aberration) are included, it is difficult to use the system in the semiconductor manufacturing apparatus for forming a fine pattern.

FIGS. 3A and 3B show examples of a reflectance and transmittance characteristic and a phase change characteristic of the beam splitter. In FIG. 3A, which shows the reflectance and transmittance characteristic, an abscissa represents an angle of incidence and an ordinate represents a reflectance and a transmittance. A solid line TA shows the transmittance and a broken line RA shows the reflectance. In FIG. 3B which shows the phase change characteristic, an abscissa represents an angle of incidence and an ordinate represents a phase change. A solid line TA shows a light transmitted through the translucent film and a broken line RA shows a light reflected by the translucent film.

How the non-uniformity of the phase change affects the resolution power is now explained.

FIG. 4 shows how the reflected light beam from the translucent film 30 is focused onto a predetermined plane by the positive lens 31. An on-axis light is directed to the translucent film 30 with the angle of incidence $\theta_0$, reflected thereby with the reflection angle $\theta_0$, and focused by the positive lens 31 to form an object image. Assuming that an angle between a principal light of a light beam reaching an off-axis image point and the optical axis is $\theta_1$, and an angle between the off-axis principal light and an off-axis peripheral light is $\theta_2$, a phase change characteristic of the light beam which contributes to the formation of the off-axis image point is in a range of $\theta_1 \pm \theta_2$ as shown in FIG. 5. FIG. 5 shows a phase change characteristic of the light reflected by the translucent film. A width of the phase change which the light beam in this range suffers in $\Delta\phi$. A wave plane aberration on a pupil plane of the optical system has a width $\Delta\phi$ which corresponds to the width of the phase change, as shown in FIG. 6. It has a characteristic to which the phase change characteristic is reflected.

As shown by a tangential line $\mu$ in FIG. 6, a gradient at the center of the pupil plane represents that an actual focusing point is displaced from a theoretical image point on the image plane. Further, since the curvature of the wave plane takes place in a plane of incidence (plane of the drawing), defocusing takes place in that plane. As a result, the curvature of the wave plane in a direction normal to the plane of incidence (plane of the drawing) is small and a substantial astigmatism is produced. Thus, where the wave plane aberration as shown in FIG. 6 is included, the displacement of image and the astigmatism take place and the image performance is deteriorated.

Considering the two off-axis light beams (having the angle of incidence $\theta_0 \pm \theta_1$) around the optical axis, it is seen that the gradient at $\theta_0 - \theta_1$ and the gradient at $\theta_0 \pm \theta_1$ are different from each other because the phase change characteristic curves as shown in FIG. 5. This means that the displacements of the image point are different and this causes the distortion of the image. Since those astigmatism and distortion aberration are non-pointsymmetrical aberrations, it is difficult to correct them in a normal optical system.

As a result, as shown in FIG. 3B, the characteristic TA of the light transmitted through the translucent film linearly changes in a large amount, and the characteristic RA of the reflected light curves in a large amount. Thus, in such a translucent film, no matter how the focusing performance of the lens system is enhanced, the degradation of the resolution power due to the phase change in the translucent film is unavoidable. The light reflected by the translucent film produces a significant astigmatism, and the distortion aberration is also unavoidable.

Contrary to the prior art construction described above, in the optical system of the present invention shown in FIG. 1, the light loss and the flare are reduced by using the polarization beam splitter, and the degradation of the resolution power and the distortion aberration can be prevented.

The inventors of the present invention have found that the polarization split plane in the polarization beam splitter, though it is of multi-layer film structure, exhibits a fairly stable phase change characteristic in the translucent film. As shown in FIG. 7B, a phase change Tp of a p-polarized light transmitted through the polarization split plane is shown by a gently sloping straight line, and a phase change Rs of a reflected s-polarized light is represented by a substantially horizontal straight line. As a result, a focused image by the p-polarized light transmitted through the polarization split plane has the wave plane somewhat inclined on the pupil plane and causes a slight displacement of the image point on the image plane, but a focused image by the s-polarized light reflected by the polarization split plane has a substantially constant phase change over a wide angle range, has no gradient of the wave plane, and maintains a high focusing performance of the optical system. FIG. 7A shows a reflectance characteristic of the polarization beam splitter.

In view of such a phase change characteristic in the polarization split plane, the present invention is characterized in that the polarization split plane is provided such that the light beam reaching from the first plane to the concave reflection mirror serves as a transmitted light beam and the light beam reflected by the concave reflection mirror and reaching the second plane serves as a reflected light beam.

It is relatively easy from a standpoint of aberration correction to convert the light beam from the first plane to a substantially collimated light beam by the first group of lenses $G_1$. In order to attain a desired reduction ratio, it is necessary from a standpoint of balance of aberration correction to converge to some extent the light beam which is reflected by the concave reflection mirror and negatively refracted by the second group of lenses $G_2$. From the above, the inventors of the present invention have found that it is advantageous to use the characteristic of the polarization beam splitter which maintains a high reflectance in a wide range of angle and includes a small phase change for the light beam which is reflected by the concave reflection mirror and transmitted through the second group of lenses $G_2$ having the negative refraction power.

As shown in FIG. 7A, the polarization beam splitter has an excellent polarization split characteristic such that the transmittance Tp of the p-polarized light transmitted with an angle of incidence of no smaller than 46 degrees is no smaller than 90%, and the reflectance of the s-polarized light Rs reflected with an angle of incidence of no larger than 58 degrees is no smaller than 90%. Further, the phase change is substantially linear. The entire image is laterally displaced due to the linear phase change but the distortion aberration does not take place. Further, since the gradient of the phase change characteristic is small, the astigmatism is small and the resolution power is not reduced. The quarter wavelength plate arranged between the polarization beam splitter and the concave reflection mirror functions to reduce the light loss and significantly reduce the flare in the second plane on which the wafer is mounted.

It is only in the angle range described above that the polarization beam splitter exhibits a good angle characteristic. Accordingly, it is desirable that the light beam directed to the polarization beam splitter is parallel to the optical axis AX1 as much as possible. It is also desirable that the light beam reflected by the polarization beam splitter and directed to the third group of lenses is substantially parallel to the optical axis AX2.

In a specific condition of the light beam, it is preferable that an angle between a peripheral light from the on-axis object point directed from the polarization beam splitter to the third group of lenses $G_3$, and the optical axis AX2 does not exceed 7 degrees in the prism. It is also preferable that an angle between the principal light from the off-axis object point directed from the polarization beam splitter to the third group of lenses $G_3$ does not exceed 5 degrees in the prism. The light beam directed from the polarization beam splitter to the third group of lenses $G_3$ is the s-polarized light converted by the quarter wavelength plate. As a result, if the angle exceed the above ranges, sufficient reflection of the s-polarized light in the polarization beam splitter is not attained and the loss of light which contributes to the focusing of image increases, the flare and focusing characteristic is deteriorated and high performance focusing of image is hardly attained.

It is also preferable that the angle of incidence of the peripheral light from the on-axis object point and the angle of incidence of the principal, light from the off-axis object point when the light is directed to the polarization beam splitter from the first group of lenses $G_1$ do not exceed 4 degrees. If the angle is too large, the light loss increases due to the transmittance characteristic of the polarization beam splitter.

It is also preferable from a standpoint of a thin film characteristic of the polarization beam splitter that the substantially collimated light beam transmitted through the polarization beam splitter is again collimated after the transmission through the second group of lenses $G_2$ via the reflection by the concave reflection mirror. To this end, it is preferable that the power of the concave reflection mirror is approximately double positive power of the negative refraction power of the second group of lenses $G_2$. To attain good aberration correction, it is desirable that a convergence power Pr of the concave reflection mirror and the negative refraction power Pn of the second group of lenses $G_2$ meet the following relation;

$$1.5|Pn|<Pr<4.0|Pn|$$

When the above upper limit is exceeded, the converging positive power of the concave reflection mirror is too strong. This is advantageous to the correction of the chromatic aberration but the light loss increases too much because of the thin film characteristic of the polarization beam splitter and the illumination efficiency is lowered. When the lower limit is exceeded, the power of the concave reflection mirror is relatively weakened and it is difficult to attain the desired reduction ratio by the concave reflection mirror. As a result, increase of the refraction powers of the first group of lenses $G_1$ and the third group of lenses $G_3$ is required and the aberrations in those lenses significantly increase.

In the above construction of the present invention, it is preferable that a radius of curvature of the concave reflection mirror is between 15 times and 25 times the diameter of the effective area (image circle) of the image formed on the second plane. The use of the concave reflection mirror attains the reduction ratio to some extent by the convergence function thereof and also permits maintaining a good aberration balance with respect to the refraction system comprising the first group of lenses $G_1$, the second group of lenses $G_2$ and the third group of lenses $G_3$, because it corrects the petzval sum, the astigmatism and the distortion aberration. When the radius of curvature of the concave reflection mirror is smaller than 15 times the diameter of the effective area of the reduced image, it is advantageous for the correction of the chromatic aberration but the petzval sum increases to a positive value and the astigmatism and the distortion aberration increase.

In order to substantially collimate the light beam passing through the polarization beam splitter before and after the reflection by the concave reflection mirror, it is necessary to increase the refraction power of the second group of lenses $G_2$ as the power of the concave reflection mirror increases. It is also necessary to increase the refraction power of the third group of lenses $G_3$ having the positive refraction power for the correction of the spherical aberration. Since the third group of lenses $G_3$ are arranged closely to the wafer plane which is the image plane, it requires a larger refraction power than the negative refraction power of the second group of lenses $G_2$ for the correction of the aberration. As a result, the petzval sum materially increases.

For better correction of the aberrations, it is preferable that the radius of curvature of the concave mirror is no smaller than 19 times the diameter of the effective area of the reduced image. On the other hand, when the radius of curvature of the concave mirror increases beyond 25 times the diameter of the effective area of the reduced image, it is advantage for the correction of the astigmatism and the distortion aberration but it is difficult to attain the desired reduction ratio and the correction of the chromatic aberration is not sufficient.

In the present invention, it is preferable that an angle $\theta_0$ between the optical axis AX1 connecting the first plane and the concave reflection mirror and the normal line to the polarization split plane of the polarization beam splitter is no smaller than 45 degrees. Namely, it is preferable that the angle of incidence and the angle of reflection of the light beam (s-polarized light) reflected by the concave mirror and the beam splitter, with respect to the plane of the beam splitter are larger than 45 degrees. This condition is required in order to use the polarization beam splitter in a good and stable condition in the light of the angle characteristic. When the angle $\theta_0$ is smaller than 45 degrees, an angle range in which the good angle characteristic is attained is narrowed and it is necessary that the light beam passing through the polarization beam splitter is more highly collimated. Thus, a limitation to the correction of the aberration of the optical system increases and it is difficult to maintain a good focusing performance.

It is also desirable that the angle between normal line to the reflection plane of the polarization beam splitter and optical axis AX1 is no larger than 55 degrees. When the angle is larger, the prism of the polarization beam splitter becomes large, the distance between the concave reflection mirror and the first plane increases, the size of the overall optical system increases, and the radius of curvature of the concave reflection mirror increases, the refraction power decreases and the chromatic aberration increases.

In the principle of the present invention shown in FIG. 1, the optical axis AX2 of the reflected light path in the beam splitter and the optical axis AX1 of the transmitted light path do not orthogonally cross. Accordingly, an auxiliary prism 14 is bonded to the beam splitter to make the ejection plane of the reflected light beam from the beam splitter normal to the optical axis AX2 to maintain the symmetry of the substantial light paths in the beam splitter cube and prevent the occurrence of non-symmetry.

It is preferable to use a uni-axial crystal (rock crystal) which is much thinner than an ordinary one, as the quarter wavelength plate, for the reason described below. When the light beam passing through the quarter wavelength plate deviates from the collimated light, astigmatism is produced with respect to an extraordinary ray. This astigmatism cannot be corrected by a method which uses an ordinary quarter wavelength plate in which two crystals are bonded with the optical axes thereof shifted 90 degrees from each other. The reason is that the astigmatism is produced for both an ordinary ray and an extraordinary ray. The astigmatism is represented by:

$$W=(n^o-n^e)d\theta^2$$

where w is a wave plane aberration, $(n^o-n^e)$ is a difference between a refractance $n^o$ for the ordinary ray and a refractance $n^e$ for the extraordinary ray, d is a thickness of the quarter wavelength plate which comprises crystals bonded together, and $\theta$ is a divergence angle (or convergence angle) of the light beam in the crystal.

When the quarter wavelength plate is formed by rock crystal and assuming that $(n^o-n^e)=0.01$ and the divergence angle (or convergence angle) $\theta$ of the light beam is approximately 7 degrees, it is necessary to maintain the wave plane aberration W within one quarter of the wavelength, that is, $W<\lambda/4$ in order to maintain sufficiently high focusing performance. To this end, it is preferable that the thickness d of the quarter wavelength plate is $$d<200\ \mu m.$$

It is preferable that the quarter wavelength plate is arranged between the polarization beam splitter and the second group of lenses. By this arrangement, the quarter wavelength plate is arranged in the substantially collimated light beam and the characteristic of the quarter wavelength plate is improved.

BRIEF DESCRIPTION OF THE DRAWINGS

FIG. 3A is a graph showing a reflectance/transmittance characteristic of a translucent film, FIG. 3B is a graph showing a phase change characteristic of the translucent film.

DESCRIPTION OF THE PREFERRED EMBODIMENTS

Figure 8:
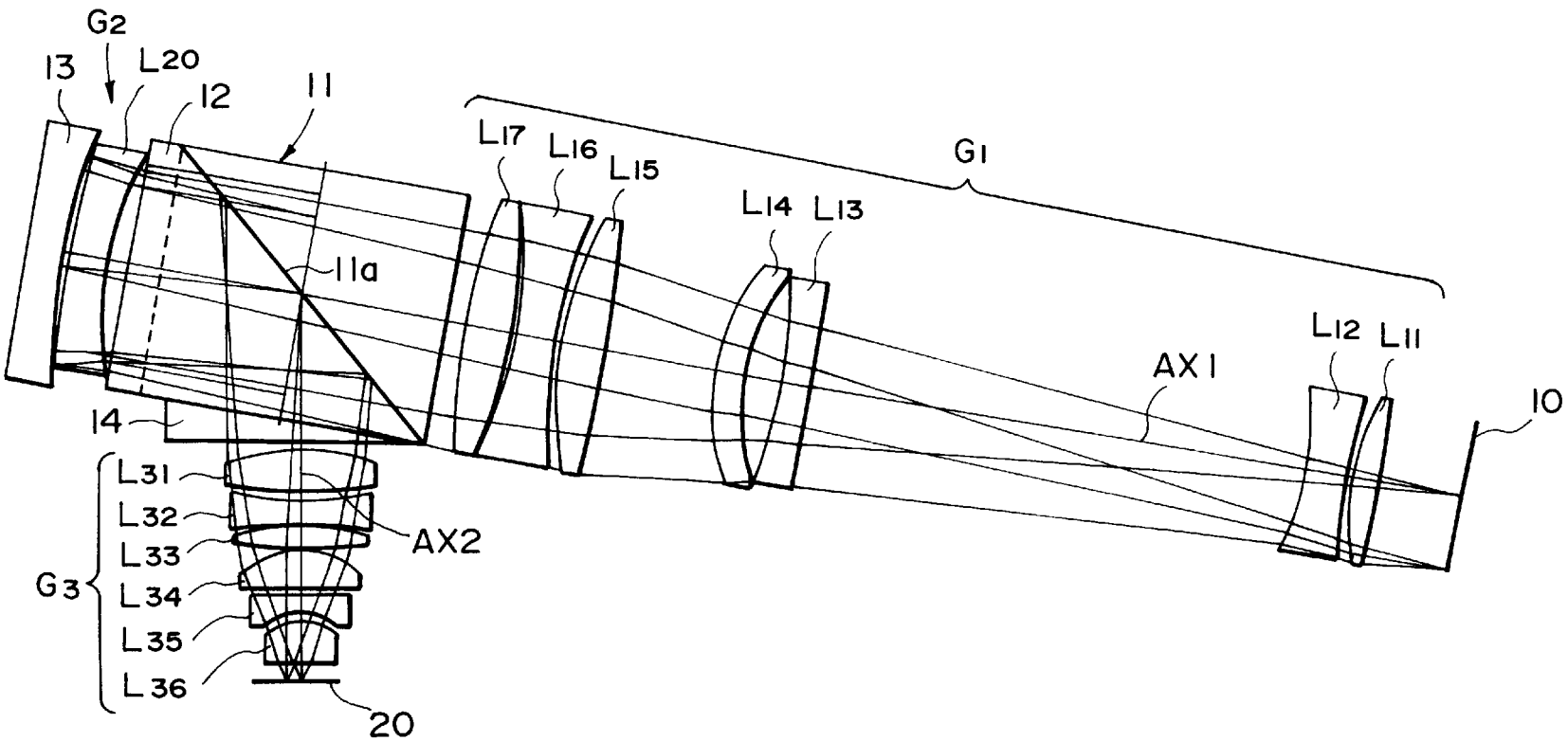
FIG. 8 shows a light path of an optical construction in one embodiment of the present invention.

FIG. 8 shows a construction of an optical system in accordance with one embodiment of the present invention.

The first plane 10 is illuminated by a linear polarized light (p-polarized light) supplied from an illumination optical system (not shown) and polarized in a direction parallel to a plane of the drawing. A light beam from an integrated circuit pattern of a reticle mounted on the first plane is converted to a substantially collimated light beam by the first group of lenses $G_1$ (first lens unit) having positive refraction force and it is directed to the polarization beam splitter 11. The first group of lenses $G_1$ comprise, in the sequence starting from the first plane, a front group having a dual convex positive lens $L_{11}$, and a dual concave negative lens $L_{12}$, and a rear group having a negative lens $L_{13}$, a meniscus lens $L_{14}$ having a concave plane facing the first plane, a positive lens $L_{15}$, a dual concave negative lens $L_{16}$ and dual convex positive lens $L_{17}$. A normal line to a polarization splitting multi-layer film plane 11*a* of the polarization beam splitter inclines to 50 degrees at an optical axis of a light path directed from the first plane 10 to the concave reflection mirror 13.

The second group of lenses $G_2$ (second lens unit) having negative refraction power comprise only a negative meniscus lens $L_{20}$ having a convex plane facing the concave reflection mirror 13. The third group of lenses $G_3$ (third lens unit) having positive refraction power for focusing the light beam reflected by the polarization beam splitter 11 onto the second plane 20 comprise, in the sequence starting from the polarization beam splitter 11, a positive lens $L_{31}$, a dual concave negative lens $L_{32}$, a dual convex positive lens $L_{33}$, a positive lens $L_{34}$ having a strong convex plane facing the beam splitter, a negative lens $L_{35}$ having a strong concave plane facing the second plane 20, and a positive lens $L_{36}$ having a strong convex plane facing the beam splitter 11.

The polarized light (p-polarized light) transmitted through the polarization beam splitter 11 passes through the quarter wavelength plate 12 is converted to a right (or left) rotating circular polarized light, and is diverged by the second group of lenses $G_2$ having the negative refraction power and directed to the concave reflection mirror 13. The converging refraction power Pr of the concave reflection mirror has the following relation with the refraction power Pn of the second group of lenses $G_2$ having the negative refraction power.

$$Pr=2.8\ |Pn|.$$

It is preferable that the radius of curvature of the concave mirror 13 be such that mirror 13 has approximately double positive refraction power of the second group of lenses $G_2$, and it is desirable to set it in the range described above in order to attain good correction of the aberration.

The light beam reflected by the concave reflection mirror 13 is converted to a circular polarized light of the opposite direction, and it passes through the second group of lenses $G_2$ and the quarter wavelength plate 12 and is focused thereby and converted to s-polarized light, which is directed to the polarization beam splitter 11. The angle of the light from the on-axis object point relative to the optical axis AX1 is approximately 4 degrees, and the angle of the principal light relative to the optical axis is approximately 3 degrees. The s-polarized light beam is reflected by the polarization beam splitter 11 and forms a reduced image of the reticle pattern on the wafer plane mounted on the second plane 20, by the third group of lenses $G_3$ having the positive refraction power.

In the present embodiment, a reference wavelength is 248 nm, a focusing magnification is reduction by a factor of 5, and the numerical of aperture is 0.45. The diameter of the effective area (image circle) of the reduction projection image is 20 mm, and the radius of curvature of the concave reflection plane is approximately 21 times as large as the diameter.

The angle between the peripheral light (so-called land light) from the on-axis object point transmitted through the polarization beam splitter 11 and the optical axis AX1 is approximately 0 degree and a maximum angle between the optical axis AX1 and the principal light is approximately 3 degrees. The angle between the normal line to the reflection plane 11*a* of the polarization beam splitter 11 and the optical axis is 50 degrees. Accordingly, looking at the range of 50±3 degrees in the characteristics shown in FIGS. 7A and 7B, the transmittance for the p-polarized light is no smaller than 95% and the phase change is linear to the angle of incidence. As to the s-polarized light reflected by the polarization beam splitter 11, the angle between the peripheral light from the on-axis object point and the optical axis is approximately 4 degrees, and a maximum angle relative to the optical axis of the principal light is approximately 3 degrees. Accordingly, in the characteristics shown in FIGS. 7A and 7B, the reflectance of the s-polarized light is no smaller than 95% in the range of 50±7 degrees, and the phase change is substantially constant for the angle of incidence.

Data of one embodiment of the optical system of the present invention is shown in the following table. The table shows the radius of curvature, the plane-to-plane spacing and the glass material in the sequence starting from the first plane which is the object plane and ending with the second plane which is the image plane. In the table, the direction of travel of the light from right to left in FIG. 8 is defined as positive, and the polarities of the radius of curvature and the refractive index of each plane are defined with reference to the direction of travel of the light. The plane-to-plane spacing is defined as positive in the medium having the positive direction of travel of the light, and negative in the medium having the negative direction of travel of the light.

The refractive indices of silica glass and fluorspar to the reference wavelength (248 nm) are as follows.

| | |
|---|---|
| Silica glass: | 1.50855 |
| Fluorspar: | 1.46799 |

In the table, it is assumed that the quarter wavelength plate 12 mounted on the silica glass is joined to the polarization beam splitter 11, and the thickness thereof is neglected because it is thin. Since the quarter wavelength plate 12 is very thin, it is necessary to support it by bonding it to the silica glass.

TABLE

| No | Radius of Curvature | Spacing | Glass Material | |
|---|---|---|---|---|
| 1 | ∞ | | | 10 |
| | | 55.000 | | |
| 2 | 453.955 | 20.000 | Silica Glass | $G_1$ |
| 3 | −169.744 | 3.000 | | |
| 4 | −462.348 | 29.000 | Silica Glass | |
| 5 | 197.498 | 331.069 | | |
| 6 | 3251.302 | 20.000 | Silica Glass | |
| 7 | 351.924 | 24.484 | | |
| 8 | −148.313 | 20.000 | Silica Glass | |
| 9 | −145.908 | 75.383 | | |
| 10 | 1165.673 | 30.000 | Silica Glass | |
| 11 | −255.389 | 4.000 | | |
| 12 | −336.804 | 27.000 | Fluorspar | |
| 13 | 305.312 | 3.000 | | |
| 14 | 350.192 | 31.000 | Silica Glass | |
| 15 | −431.917 | | | |
| | | 11.987 | | |
| 16 | ∞ | 216.000 | Silica Glass | 11 |
| 17 | ∞ | | | (12) |
| | | 15.000 | | |
| 18 | −204.923 | 25.000 | Silica Glass | $G_2$ |
| 19 | −634.284 | | | |
| | | 4.200 | | |
| 20 | −419.364 | | | 13 |
| | | −4.200 | | |
| 21 | −634.284 | −25.000 | Silica Glass | |
| 22 | −204.923 | | | |
| | | −15.000 | | |
| 23 | ∞ | −116.000 | Silica Glass | (12) |
| 24 | ∞ | 98.000 | | 11 |
| 25 | ∞ | | | |
| | | 3.989 | | $G_3$ |
| 26 | 152.202 | 28.000 | Fluorspar | |
| 27 | −329.930 | 5.000 | | |
| 28 | −207.876 | 17.000 | Silica Glass | |
| 29 | 356.057 | 0.300 | | |
| 30 | 200.603 | 15.500 | Fluorspar | |
| 31 | −340.783 | 0.400 | | |
| 32 | 57.413 | 25.500 | Fluorspar | |
| 33 | 1411.592 | 3.000 | | |
| 34 | 2276.589 | 12.900 | Silica Glass | |
| 35 | 34.616 | 5.412 | | |
| 36 | 42.071 | 27.700 | Fluorspar | |
| 37 | 1437.730 | | | |
| | | 12.000 | | |
| 38 | ∞ | | | 20 |

Figure 1:
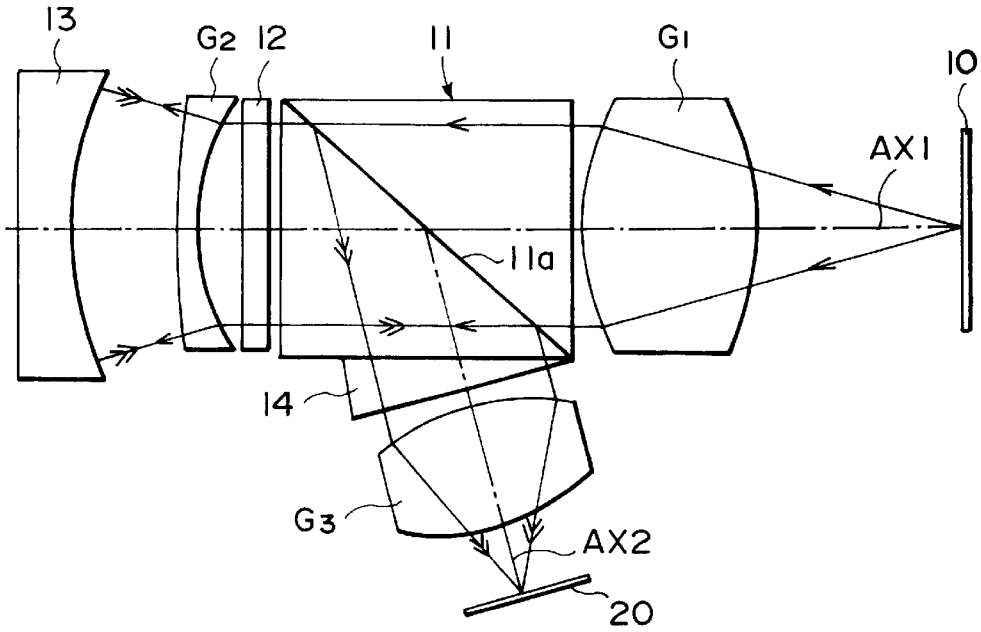
FIG. 1 shows a light path of a principle construction of an optical system of the present invention.
Figure 2:
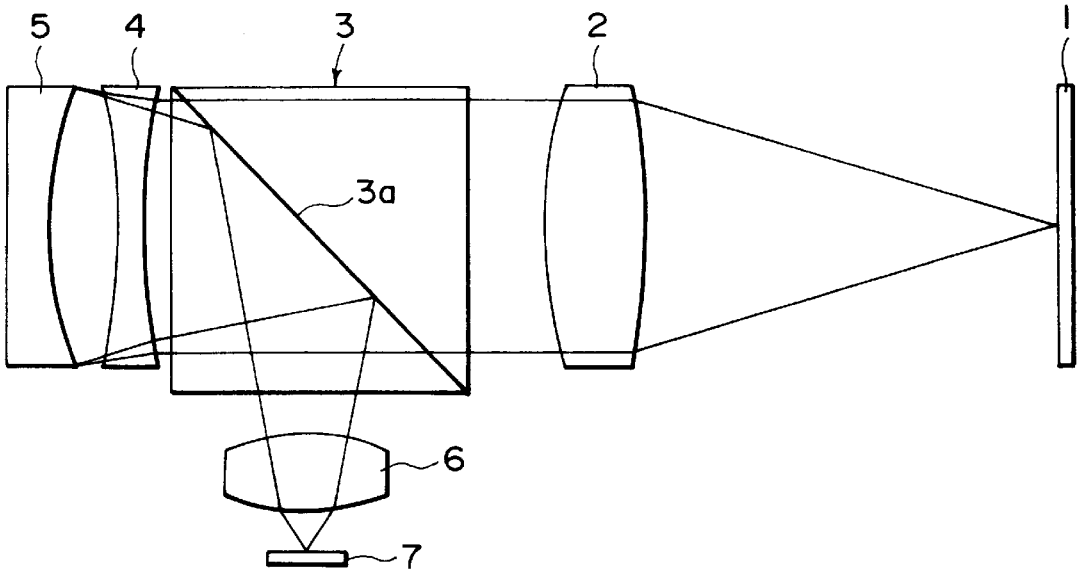
FIG. 2 PRIOR ART
FIG. 2 shows a light path of a general construction of a prior art optical system.
Figure 4:
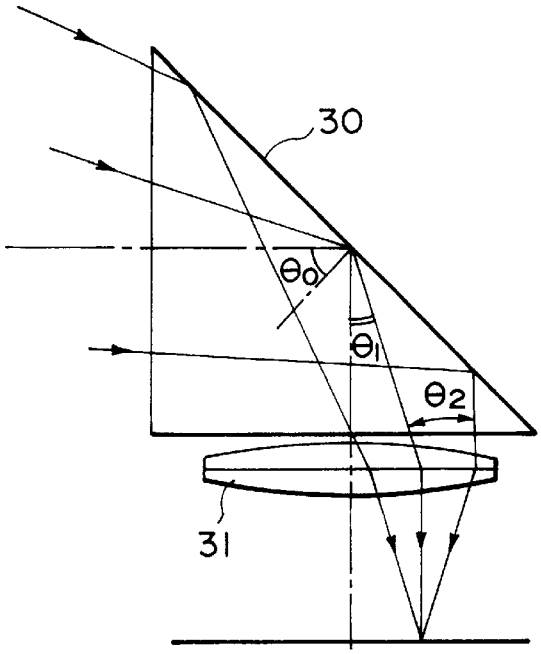
FIG. 4 shows a light path of focusing by reflection of the translucent film and a positive lens.
Figure 5:
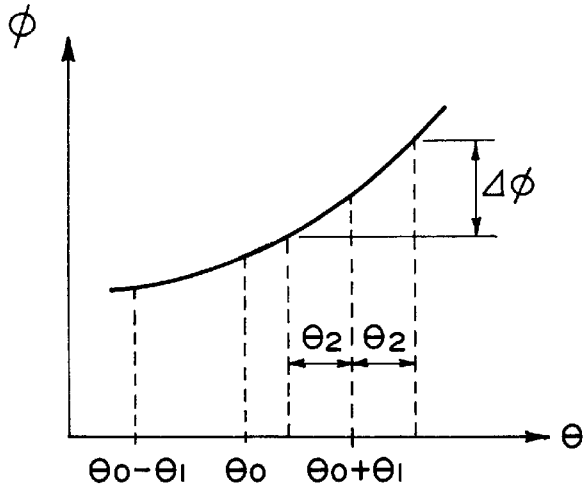
FIG. 5 is a graph showing a phase change characteristic of a reflected light by the translucent film.
Figure 6:
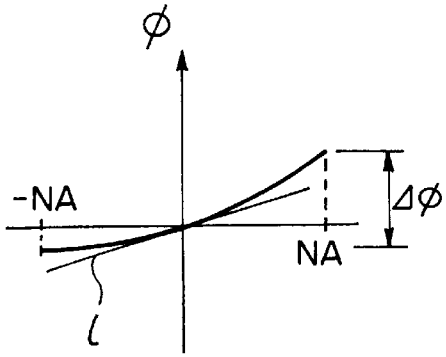
FIG. 6 shows a wave plane aberration in a pupil of the optical system.
Figure 7A:
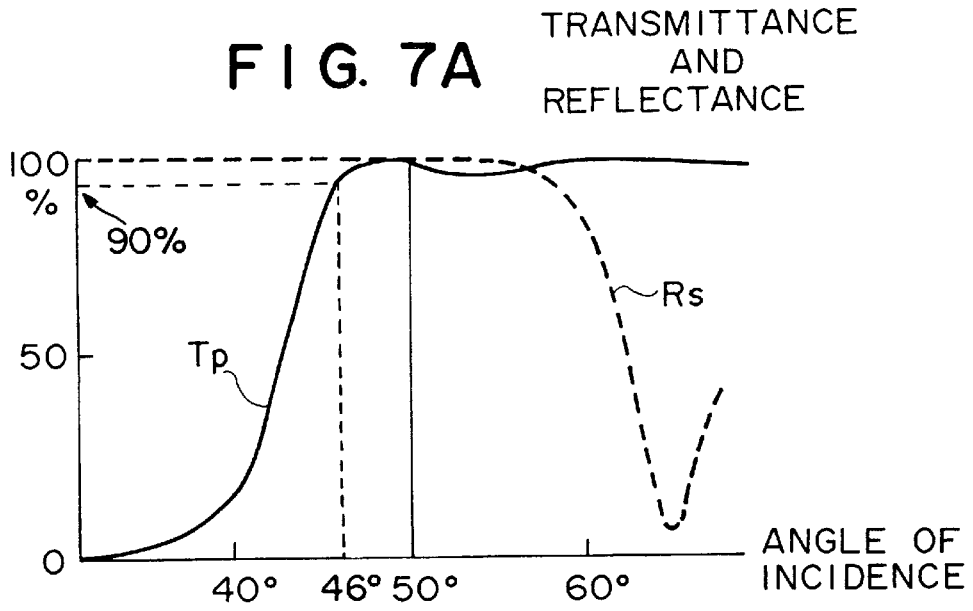
FIG. 7A is a graph showing a reflectance/transmittance characteristic of a polarization beam splitter of the present invention.
Figure 7B:
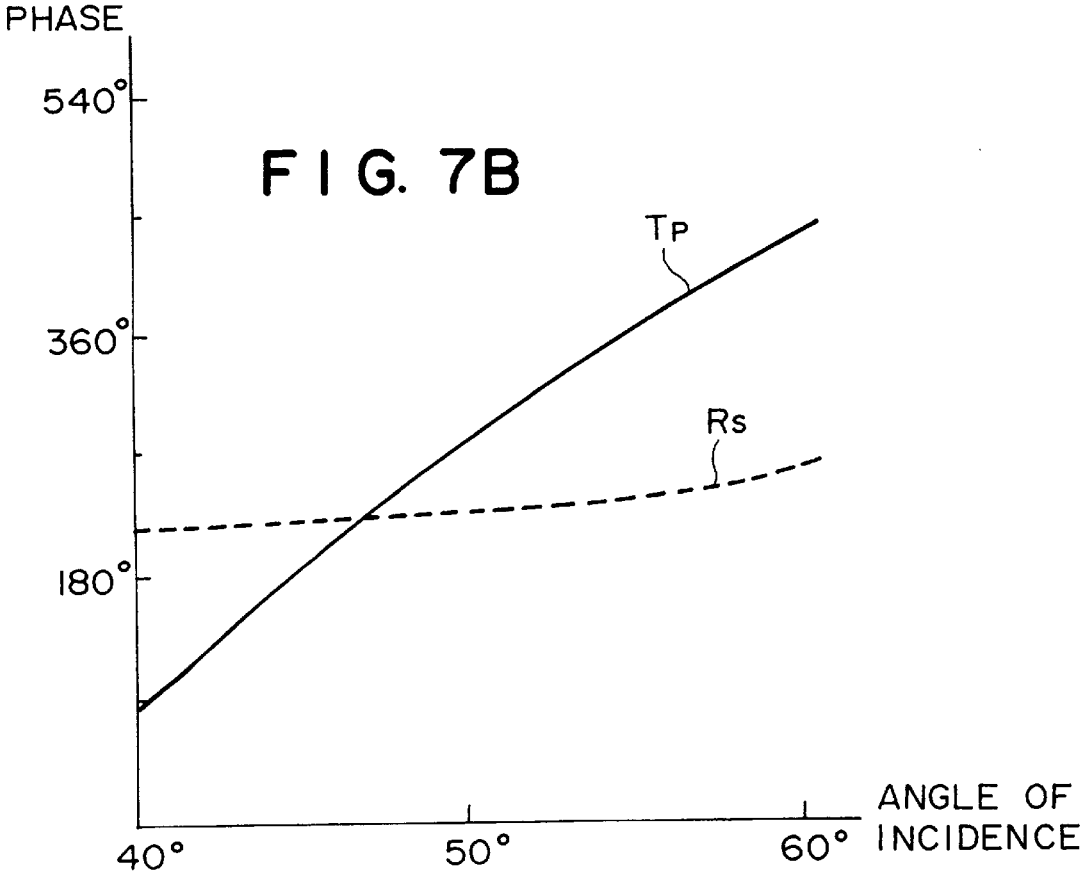
FIG. 7B is a graph showing a phase change characteristic of the polarization beam splitter of the present invention.

The thin film structure of the polarization beam splitter used in the present embodiment comprises 21 layers, and hafnium oxide $HfO_2$ is used as a high refractive index material while silicon oxide $SiO_2$ is used as a low refractive index material, and the angle of incidence is set to 50 degrees. FIGS. 7A and 7B show the characteristics of the polarization beam splitter constructed in this manner. As seen from the angle characteristic graphs, the reflectance of the s-polarized light is no smaller than 95% in the range of 50±7 degrees, and the transmittance of the p-polarized light is no smaller than 95% in the range of 50±3 degrees. In this range, the phase change is a gently sloping straight line or constant, and no distortion aberration nor the degradation of image takes place as explained earlier. Other useful high refractive index materials are $Y_{23}$, $Sc_2O_3$, $Al_2O_3$ and MgO, and other useful low refractive index materials are $YF_3$, $MgF_2$, $LaF_3$, $SiO_2$ and LiF.

The characteristics of the prior art translucent film shown in FIGS. 3A and 3B were measured by using alumina $Al_2O_3$ as the high refractive material, and silicon oxide $SiO_2$ as the low refractive material to form 31 layers, and with the angle of incidence of 45 degrees.

In the above embodiment, the second group of lenses $G_2$ having the negative refraction power comprise a single negative meniscus lens. The present invention is not limited to the embodiment, and the second group comprise a plurality of lenses. By using the concave reflection plane as a rear reflection plane of the negative lens, it is possible to integrally construct the second group of lenses $G_2$ and the concave reflection plane.

We claim:

1. A reduction projection optical system comprising:

a first lens unit having a positive refraction power for converting a light beam from a first plane on which an object is mounted into a substantially collimated light beam;

a polarization beam splitter for transmitting the light beam from said first lens unit, said polarization beam splitter including a polarization split plane which transmits a p-polarized light beam and reflects an s-polarized light beam;

a second lens unit arranged in the light path of said light beam from said first lens unit transmitted through said polarization beam splitter, said second lens unit having a negative refraction power for diverging the transmitted light beam;

a concave reflection mirror for converging the light beam diverged by said second lens unit and directing it back to said polarization beam splitter;

a quarter wavelength plate arranged between said [polarizing] *polarization* beam splitter and said concave reflection mirror, for converting the p-polarized light beam from said polarization beam splitter into an s-polarized light beam that is directed back to said polarization beam splitter after reflection on the concave reflection mirror; and a third lens unit having a positive refraction power for converging the light beam reflected by said concave reflection mirror and directed back to the polarization beam [splitting] *splitter* to form a reduced image of the first plane onto a second plane;

wherein said polarization split plane of said polarization beam splitter is disposed in such a manner that an angle of incidence and an angle of reflection of an on-axis light beam reflected by said polarization beam splitter with respect to said polarization split plane of the beam splitter are larger than 45 degrees.

2. A reduction projection optical system according to claim 1 wherein said polarization beam splitter includes a beam splitter cube having a plurality of prisms and a polarization split plane formed between the prisms, and an angle between peripheral light from an on-axis object point directed from said beam splitter cube to said third lens unit and an optical axis of the optical system does not exceed 7 degrees in the prism.

3. A reduction projection optical system according to claim 1 wherein said polarization beam splitter includes a beam splitter cube having a plurality of prisms and a polarization split plane formed between the prisms, and an angle between peripheral light from an off-axis object point directed from said beam splitter cube to said third lens unit and an optical axis of the optical system does not exceed 5 degrees.

4. A reduction projection optical system according to claim 1 wherein a power Pr of said concave reflection mirror and a negative refraction power Pn of said second lens unit meet a requirement of $$1.5|Pn|<Pr<4.0|Pn|.$$

5. A reduction projection optical system according to claim 1 wherein a radius of curvature of said concave reflection mirror is between 15 times and 25 times a diameter of an effective area of the image of the object formed on said second plane.

6. A reduction projection optical system according to claim 1 wherein said quarter wavelength plate is made of rock crystal and has a thickness no larger than 200 $\mu$m.

7. A reduction projection optical system according to claim 1 wherein said quarter wavelength plate is arranged between said polarization beam splitter and said second lens unit.

8. A reduction projection optical system according to claim 1, wherein said polarization beam splitter includes a beam splitter cube that has two prisms forming said polarization split plane [therebewteen] *therebetween* and an auxiliary prism having an exit surface from which the s-polarized light beam directed back to said polarization beam splitter is emitted, said exit surface being normal to an optical axis of the emitted light beam to maintain symmetry of the light path.

9. A reduction projection optical system according to claim 8, wherein said angle between the optical axis of the light path directed from said first plane to said concave reflection mirror and the normal line to said polarization split plane is no larger than 55 degrees.

10. A reduction projection optical system comprising:

a first lens unit having a positive refraction power for converting a light beam from a first plane on which an object is mounted into a substantially collimated light beam;

a polarization beam splitter for splitting the light beam from said first lens unit in accordance with a polarization state;

a second lens unit having a negative refraction power arranged in the light path of a light beam split by said polarization beam splitter for diverging the split light beam;

a concave reflection mirror for converging the light beam from said second lens unit and directing it back to said polarization beam splitter through said second lens unit, said concave reflection mirror meeting a requirement of:

$$1.5|Pn|<Pr<4.0|Pn|$$

where Pr is a power of said concave reflection mirror and Pn is a negative refraction power of said second lens unit, and a third lens unit having a positive refraction power for converging the light beam converged by said concave reflection mirror and directed back to said polarization beam splitter to form a reduced image of the object on said first plane onto a second plane.

11. A reduction projection optical system according to claim 10, wherein said polarization beam splitter transmits the light beam directed from said first plane to said concave reflection mirror, and reflects the light beam converged by said concave reflection mirror and directed back to said polarization beam splitter.

12. A reduction projection optical system according to claim 10, wherein said polarization beam splitter has a polarization split plane, and an angle between an optical axis of a light path directed from said first plane to said concave reflection mirror and a normal line to said polarization split plane is no smaller than 45 degrees.

13. A reduction projection optical system comprising:

a first lens unit having a positive refraction power for converting a light beam from a first plane on which an object is mounted into a substantially collimated light beam;

a polarization beam splitter for splitting the light beam from said first lens unit into a reflected light beam and a transmitted light beam in accordance with a polarization state, said polarization beam splitter having a polarization split plane which transmits a p-polarized light beam and reflects an s-polarized light beam and which is of multi-layer film structure having a substantially linear phase change characteristic to [the] *an* incident angle;

a second lens unit arranged in the light path of a light beam split by said polarization beam splitter and having a negative refraction power for diverging the split light beam;

a concave reflection mirror for converging the light beam diverged by said second lens unit and directing it back to said polarization beam splitter;

a quarter wavelength plate arranged between said [polarizing] *polarization* beam splitter and said concave reflection mirror, for converting the p-polarized light beam from said polarization beam splitter into an s-polarized light beam that is directed back to said polarization beam splitter after reflection on the concave reflection mirror, and a third lens unit having a positive refraction power for converging the light beam reflected by said concave reflection mirror and directed back to the polarization beam splitter to form a reduced image of the first plane onto a second plane;

wherein said polarization split plane of said polarization beam splitter has such a phase change characteristic to the incident angle that a phase change Tp of a p-polarized light beam transmitted through said polarization split plane is represented by a gently sloping straight line and a phase change Rs of a reflected s-polarized light beam is represented by a substantially horizontal straight line.

14. A reduction projection optical system according to claim 13, wherein said polarization split plane of said polarization beam splitter is disposed in such a manner that an angle between an optical axis of a light path directed from said first plane to said concave reflection mirror and a normal line to said polarization split plane is no smaller than 45 degrees.

15. A reduction projection optical system according to claim 14, wherein a radius of curvature of said concave reflection mirror is between 19 times and 25 times a diameter of an effective area of the image of the object formed on said second plane.

16. A reduction projection optical system according to claim 14, wherein said angle between the optical axis of the light path directed from said first plane to said concave reflection mirror and the normal line to said polarization split plane is no larger than 55 degrees.

17. A reduction projection optical system according to claim 16, wherein a power Pr of said concave reflection mirror and a negative refraction power Pn of said second lens unit satisfy a condition of $$1.5|Pn|<Pr<4.0|Pn|.$$

18. A reduction projection optical system comprising:

a first lens unit having a positive refraction power for converting a light beam from a first plane on which an object is mounted into a substantially collimated light beam;

a polarization beam splitter for splitting the light beam from said first lens unit, said polarization beam splitter including a polarization split plane which transmits a p-polarized light beam and reflects an s-polarized light beam;

a second lens unit arranged in the light path of a light beam from said [fist] *first* lens unit transmitted through said polarization beam splitter, said second lens unit having a negative refraction power for diverging the transmitted light beam;

a concave reflection mirror for converging the light beam diverged by said second lens unit and directing it back to said polarization beam splitter;

a quarter wavelength plate arranged between said [polarizing] *polarization* beam splitter and said concave reflection mirror, for converting the p-polarized light beam from said polarization beam splitter into an s-polarized light beam that is directed back to said polarization beam splitter after reflection on the concave reflection mirror; and a third lens unit having a positive refraction power for converging the light beam converged by said concave reflection mirror and directed back to the polarization beam splitter to form a reduced image of the first plane onto a second plane;

wherein said polarization split plane of said polarization beam splitter is disposed in such a manner that an angle between an optical axis of a light path directed from said concave reflection mirror to said polarization split plane and a normal line of said polarization split plane at a concave reflection mirror side of said split [lane] *plane* is larger than 45 degrees.

19. A reduction projection optical system according to claim 18, wherein said polarization beam splitter has a beam splitter cube which includes two prisms forming said polarization split plane [therebewteen] *therebetween* and an exit surface from which the s-polarized light beam reflected on said polarization split plane is emitted, said exit surface of said beam splitter cube being normal to an optical axis of [said] *the* reflected light path in said polarization beam [slitter] *splitter* to maintain the symmetry of the light path.

20. A reduction projection optical system according to claim 19, wherein a power Pr of said concave reflection mirror and a negative refraction power Pn of said second lens unit satisfy a condition of:

$$1.5|Pn|<Pr<4.0|Pn|.$$

21. A reduction projection optical system comprising:

a first [lend] *lens* unit having a positive refraction power for converging a light beam from a first plane into a substantially collimated light beam;

a beam splitter for splitting a light beam path from said first lens unit into a reflected light beam path and a transmitted light beam path;

a second lens unit having a negative refraction power arranged in one of [said] *the* two light beam paths split by said beam splitter for diverging a light beam emitted from said beam splitter;

a concave reflection mirror for converging the diverged light beam from said second lens unit and directing it back to said beam splitter, and a third lens unit having a positive refraction power for converging the light beam converged by said concave reflection mirror and directed back to the beam splitter to form a reduced image of the first plane onto a second plane, wherein a power Pr of said concave reflection mirror and a negative refraction power Pn of said second lens unit satisfy a condition of $$[1.5|Pn|<4.0|Pn|]\ 1.5\ |Pn|<Pr<4.0\ |Pn|.$$

22. A reduction projection optical system according to claim 21, wherein a radius of said concave reflection mirror is between 15 times and 25 times the diameter of the image circle of said reduced image on said second plane.

23. A reduction projection optical system according to claim 22, wherein a radius of said concave reflection mirror is no smaller than 19 times the diameter of the image circle of said reduced image on said second plane.

24. A reduction projection optical system according to claim 21, wherein said beam splitter comprises a polarization beam splitter for splitting the light beam path from said first lens unit into said reflected light beam path and said transmitted light beam path in accordance with a polarization state of the light beam from said first lens unit.

25. A reduction projection optical system according to claim 24, further comprising a quarter wavelength plate disposed between said [polarizing] *polarization* beam splitter and said concave reflection mirror, for converting a polarized light beam from said polarization beam splitter into a different polarized light beam directed back to said polarization beam splitter after reflection on the concave reflection mirror.

26. A reduction projection optical system comprising:

a first lens unit having a positive refraction power for converting a light beam from a first plane into a substantially collimated light beam;

a beam splitter for splitting a light beam path from said first lens unit into a reflected light beam path and a transmitted light beam path;

a second lens unit having a negative refraction power arranged in one of [said] *the* two light beam paths split by said beam splitter for diverging a light beam emitted from said beam splitter, a concave reflection mirror for converging the diverged light beam from said second lens unit and directing it back to said beam splitter, and a third lens unit having a positive refraction power for converging the light beam converged by said concave reflection mirror and directed back to the beam splitter to form a reduced image of the first plane onto a second plane;

wherein a radius of said concave reflection mirror is between 15 times and 25 times the diameter of the image circle of said reduced image on said second plane.

27. A reduction projection optical system according to claim 26, wherein a radius of said concave reflection mirror is no smaller than 19 times the diameter of the image circle of said reduced image on said second plane.

28. A reduction projection optical system comprising:

a first lens unit having a positive refraction power for converting a light beam from a first plane into a substantially collimated light beam;

a polarization beam splitter for splitting a light beam path from said first lens unit into a reflected light beam path and a transmitted light beam path in accordance with a polarization state of [alight] *a light* beam from said first lens unit;

a second lens unit having a negative refraction power arranged in one of [said] *the* two light beam paths split by said polarization beam splitter for diverging a light beam emitted from said polarization beam splitter;

a concave reflection mirror for converging the diverged light beam from said second lens unit and directing it back to said beam splitter, and a third lens unit having a positive refraction power for converging the light beam converged by said concave reflection mirror and directed back to the polarization beam splitter to form a reduced image of the first plane onto a second plane; and a quarter wavelength plate arranged between said [polarizing] *polarization* beam splitter and said concave reflection mirror, for converting the p-polarized light beam from said polarization beam splitter into an s-polarized light beam directed back to said polarization beam splitter after reflection on the concave reflection mirror, wherein said quarter wavelength plate is made of rock crystal and has a thickness of no greater than 200 $\mu$m.

29. A reduction projection optical system according to claim 28, wherein said quarter wavelength plate is positioned between said polarization beam splitter and said second lens unit.

30. A reduction projection optical system for projecting a reduced image of an object on a first plane onto a second plane comprising:

a first lens unit having a positive refraction power for converting a light beam from a first plane into a substantially collimated light beam;

a polarization beam splitter for splitting a light beam path from said first lens unit into a reflected light beam path and a transmitted light beam path in accordance with a polarization state of [alight] *a light* beam from said first lens unit;

a second lens unit having a negative refraction power arranged in one of [said] *the* two light beam paths split by said polarization beam splitter for diverging a light beam emitted from said polarization beam splitter;

a concave reflection mirror for converging the diverged light beam from said second lens unit and directing it back to said beam splitter; and a third lens unit having a positive refraction power for converging the light beam converged by said concave reflection mirror and directed back to the polarization beam splitter to form a reduced image of the first plane onto a second plane; and a quarter wavelength plate arranged between said [polarizing] *polarization* beam splitter and said concave reflection mirror, for converting the p-polarized light beam from said polarization beam splitter into an s-polarized light beam directed back to said polarization beam splitter after reflection on the concave reflection mirror;

wherein an angle between peripheral light from an on-axis object point directed from said beam splitter to said third lens unit and an optical axis of the optical system does not exceed 7 degrees.

31. A reduction projection optical system according to claim 30, wherein said polarization beam splitter includes a beam splitter cube having a plurality of prisms and a polarization split plane formed between the prisms, and an angle between peripheral light from an on-axis object point directed from said beam splitter cube to said third lens unit and an optical axis of the optical system does not exceed 7 degrees in said prisms.

*32. A catadioptric optical reduction system comprising:*

*a first optical unit including refractive elements made from at least two different materials;*

*a polarization beam splitter;*

*a quarter wavelength plate;*

*a second optical unit including a concave reflection mirror; and*

*a third optical unit including refractive elements made from at least two different materials;*

*arranged such that light rays entering the system pass through said first optical unit, said polarization beam splitter and said quarter wavelength plate, are reflected by said concave reflection mirror in said second optical unit back to said quarter wavelength plate, reach said polarization beam splitter, and then pass through said third optical unit.*

*33. A catadioptric optical reduction system for projecting an image of a first plane onto a second plane, comprising:*

*a first optical unit including refractive elements made from at least two different materials;*

*a polarization beam splitter;*

*a quarter wavelength plate;*

*a second optical unit including a concave reflection mirror and a refractive element; and*

*a third optical unit including refractive elements made from at least two different materials;*

*arranged such that light rays from said first plane entering the system pass through said first optical unit, through said polarization beam splitter, through said quarter wavelength plate, and through the refractive element in said second optical unit, are reflected by the concave reflection mirror in said second optical unit back to said quarter wavelength plate, reach said polarization beam splitter, and pass through said third optical unit to said second plane.*

* * * * *